(12) United States Patent
Twarog et al.

(10) Patent No.: US 10,470,311 B2
(45) Date of Patent: Nov. 5, 2019

(54) CLEARANCE SIZE REDUCTION FOR BACKDRILLED DIFFERENTIAL VIAS

(71) Applicant: Juniper Networks, Inc., Sunnyvale, CA (US)

(72) Inventors: Matthew Twarog, Hubbardston, MA (US); Hui He, San Jose, CA (US); Thomas W. Jetton, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/719,168

(22) Filed: Sep. 28, 2017

(65) Prior Publication Data

US 2019/0098765 A1    Mar. 28, 2019

(51) Int. Cl.
*H05K 1/11* (2006.01)
*H05K 1/02* (2006.01)
*H05K 3/00* (2006.01)
*H05K 3/46* (2006.01)
*H05K 3/40* (2006.01)

(52) U.S. Cl.
CPC ......... *H05K 3/0047* (2013.01); *H05K 1/0245* (2013.01); *H05K 1/115* (2013.01); *H05K 3/4038* (2013.01); *H05K 3/46* (2013.01); *H05K 2201/09609* (2013.01)

(58) Field of Classification Search
CPC ... H05K 2201/093; H05K 2201/09718; H05K 2203/0207; H05K 1/0245; H05K 1/0251; H05K 1/0253; H05K 1/115; H05K 1/116; H05K 2201/09609; H05K 3/46; H05K 3/4038; H05K 3/0047
See application file for complete search history.

(56) References Cited

U.S. PATENT DOCUMENTS

| | | | | |
|---|---|---|---|---|
| 5,764,489 A | * | 6/1998 | Leigh | H05K 1/0219 174/261 |
| 6,744,130 B1 | * | 6/2004 | Miller | H05K 1/0245 257/691 |
| 7,141,742 B2 | | 11/2006 | Barr et al. | |

(Continued)

OTHER PUBLICATIONS

Altera, "Via Optimization Techniques for High-Speed Channel Designs," https://www.altera.com/en_US/pdfs/literature/an/an529.pdf, May 2008, 19 pages.

*Primary Examiner* — Roshn K Varghese
(74) *Attorney, Agent, or Firm* — Harrity & Harrity, LLP (57) ABSTRACT

A printed circuit board (PCB) may include a plurality of horizontally disposed signal layers. The PCB may include a first vertically disposed differential via electrically connected to a first horizontally disposed signal layer, of the plurality of horizontally disposed signal layers, and a second horizontally disposed signal layer of the plurality of horizontally disposed signal layers. The PCB may include a second vertically disposed differential via electrically connected to the first signal horizontally disposed layer and the second horizontally disposed signal layer. The PCB may include a first set of clearances encompassing the first vertically disposed differential via and the second vertically disposed differential via, a second set of clearances encompassing the first vertically disposed stub, and a third set of clearances encompassing the second vertically disposed stub.

20 Claims, 7 Drawing Sheets

(56) References Cited

U.S. PATENT DOCUMENTS

| | | | |
|---|---|---|---|
| 7,348,498 B2 | 3/2008 | Barr et al. | |
| 8,199,522 B2 | 6/2012 | Hsu et al. | |
| 9,084,353 B2* | 7/2015 | De Geest | H05K 1/024 |
| 9,202,783 B1 | 12/2015 | Simpson et al. | |
| 9,526,178 B2 | 12/2016 | Yang et al. | |
| 9,666,544 B2 | 5/2017 | Zu et al. | |
| 2007/0089292 A1 | 4/2007 | Tourne et al. | |
| 2009/0294168 A1* | 12/2009 | Pai | H05K 1/0251 174/266 |
| 2011/0132648 A1* | 6/2011 | Mutnury | H05K 1/0245 174/260 |
| 2011/0240348 A1* | 10/2011 | Lau | H05K 1/0251 174/257 |
| 2013/0098671 A1* | 4/2013 | Thurairajaratnam | H05K 1/024 174/266 |
| 2013/0248236 A1* | 9/2013 | Mutnury | H05K 1/024 174/264 |
| 2014/0182891 A1* | 7/2014 | Rengarajan | H05K 1/0222 174/251 |
| 2016/0172734 A1 | 6/2016 | Wang et al. | |
| 2017/0331250 A1* | 11/2017 | Kagaya | H01P 3/026 |

\* cited by examiner

CLEARANCE SIZE REDUCTION FOR BACKDRILLED DIFFERENTIAL VIAS

BACKGROUND

A printed circuit board (PCB) can include clearances, used to provide clearance for backdrilling, which might be sized to allow backdrilling in a way that minimizes the presence of stubs.

SUMMARY

According to some possible implementations, a printed circuit board (PCB) may include a plurality of horizontally disposed signal layers; a first vertically disposed differential via electrically connected to a first horizontally disposed signal layer, of the plurality of horizontally disposed signal layers, and a second horizontally disposed signal layer of the plurality of horizontally disposed signal layers, the first vertically disposed differential via including a first vertically disposed stub that extends from a bottom surface of the PCB to the second horizontally disposed signal layer; a second vertically disposed differential via electrically connected to the first signal horizontally disposed layer and the second horizontally disposed signal layer, the second vertically disposed differential via including a second vertically disposed stub that extends from the bottom surface of the PCB to the second horizontally disposed signal layer; a first set of clearances encompassing the first vertically disposed differential via and the second vertically disposed differential via, a second set of clearances encompassing the first vertically disposed stub; and a third set of clearances encompassing the second vertically disposed stub.

According to some possible implementations, a device may include a plurality of horizontally disposed layers; a first differential via electrically connected to a first horizontally disposed layer, of the plurality of horizontally disposed layers, and a second horizontally disposed layer of the plurality of horizontally disposed layers, the first differential via being vertically disposed and including a first vertically disposed stub that extends from a bottom surface of the device to the second horizontally disposed layer; a second differential via electrically connected to the first horizontally disposed layer and the second horizontally disposed layer, the second differential via being vertically disposed and including a second vertically disposed stub that extends from the bottom surface of the device to the second horizontally disposed layer; a first set of clearances associated with the first differential via and the second differential via; and a second set of clearances associated with the first vertically disposed stub and the second vertically disposed stub.

According to some possible implementations, a method may include fabricating a printed circuit board (PCB) to include a plurality of horizontally disposed signal layers; a first vertically disposed differential via electrically connected to a first horizontally disposed signal layer, of the plurality of horizontally disposed signal layers, and a second horizontally disposed signal layer of the plurality of horizontally disposed signal layers, the first vertically disposed differential via including a first vertically disposed stub that extends from a bottom surface of the PCB to the second horizontally disposed signal layer; a second vertically disposed differential via electrically connected to the first horizontally disposed signal layer and the second horizontally disposed signal layer, the second vertically disposed differential via including a second vertically disposed stub that extends from the bottom surface of the PCB to the second horizontally disposed signal layer; a first set of clearances associated with first vertically disposed differential via and the second vertically disposed differential via; and a second set of clearances encompassing the first vertically disposed stub and the second vertically disposed stub.

DETAILED DESCRIPTION

The following detailed description of example implementations refers to the accompanying drawings. The same reference numbers in different drawings may identify the same or similar elements.

A printed circuit board (PCB) can include one or more material layers that mechanically support and electrically connect electronic components using conductive pathways. The conductive pathways might be etched from copper sheets laminated onto a non-conductive substrate. The pathways might be organized as a number of layers on the PCB in order to increase the signal transmission density of the PCB. A PCB, after being populated with electronic components, is commonly referred to as a printed circuit assembly (PCA).

PCBs might be used in high-frequency applications. For example, a PCB might be populated with an integrated circuit used to enable high speed serial links to and from the PCB, as might be utilized for an Ethernet switch, a serializer/deserializer (SerDes), and/or the like. In a high-frequency application, the PCB can experience significant signal integrity disturbances as a result of the unused portions of through-holes and vias, called stubs, that extend past the last connected layer of the PCB. The stubs can present resonances, impedance discontinuities, and increase the loss of the channel, thereby limiting performance.

For low density and low data rate serial links (e.g., <5 Gigabits per second (Gb/s)), the signal lines are commonly routed on thin PCB substrates with ball grid arrays (BGAs) connected to short vias, and can tolerate small stubs and present few challenges with power delivery. For example, the deleterious effects of a stub increases with the size of a stub (e.g., a stub length). As the serial link speed and density increase, the PCB substrate thickness might be increased to accommodate more signal lines, which can in turn cause an increase in the stub length and a corresponding increase in signal integrity disturbances.

One technique for reducing stub length is known as backdrilling. Backdrilling is a controlled depth drilling (CDD) technique that removes stubs with numerically controlled drill equipment. Clearances might be used to provide clearance for backdrilling.

In order to remove the unused metalized portion of a hole with the backdrilling process, it is necessary for there to be, on each layer, a clear area free of any metal features that may be harmed by the drill bit. The size and shape of the clearance around a hole on any particular layer is determined according to the purpose being served by that clearance. There are a number of different considerations that might influence the size and shape. The diameter of the backdrill is only one of the possible considerations. Another possible consideration is the need to limit the amount of fringe capacitance on high-speed signals. These signals typically utilize differential-pair constructions including two signals routed closely together. Where these two signal pass through the layers of the PCB through plated holes, those holes are placed very close together (e.g., approximately one millimeter). Typically, there are oval shaped clearances around these pairs of holes on all layers that limit the proximity of metal that may create unwanted capacitance on the two differential pair signals.

In some cases, a set of vertically disposed differential vias can route differential signals from one horizontally disposed layer of a PCB to another horizontally disposed layer of the PCB. For example, a set of differential vias can include transmitter (TX) vias used to carry a differential pair of signals (e.g., a positive signal and a negative signal) transmitted by a component connected to the PCB (e.g., for differential signaling). As another example, the set of differential vias can include a set of receiver (RX) vias used to carry a differential pair of signals to be received by the component connected to the PCB.

Each of the two vias within a differential-pair might be encompassed by a round clearance area (sometimes referred to in the industry as an anti-pad). These two clearances separate the plated via hole from the other metal features, and protect other features from damage by the backdrill. Additionally, there might be an oval-shaped clearance layer overlapping the previously described round clearances. This oval shaped clearance encompasses both vias that make up the differential-pair and might be used to limit unwanted capacitance.

The differential vias might be encompassed by a set of clearances. For example, a clearance, on a particular layer of the PCB, can encompass both differential vias and can function to isolate the differential vias from the PCB layer traversed by the differential via. The clearance might be sized to reduce a capacitance of the differential vias, and to more closely match an impedance of the differential vias with an impedance of conductive traces on the layer of the PCB. In other words, the clearances might be sized to mitigate the deleterious effects associated with signal integrity disturbances.

In some cases, stubs associated with differential vias might be encompassed by clearances that include similar dimensions (e.g., diameters, radii, widths, lengths, and/or the like) as clearances that encompass the differential vias. In high density PCBs, such a configuration is problematic because the size of the clearances, encompassing the stubs, reduces the amount of available area for metal conductive material that could otherwise be used for signal lines or power distribution. Additionally, a conductive trace might be required to be routed around a clearance in situations where the clearance encompasses both stubs associated with both differential vias, thereby resulting in an increase in an overall length of the conductive trace as compared to a situation where the conductive trace is capable of being routed between the stubs associated with the differential vias.

Some implementations described herein provide a PCB, and a method of fabricating the PCB, that includes a first set of clearances that encompasses both differential vias, of a pair of differential vias, on a first set of layers of the PCB. Additionally, some implementations described herein provide a PCB that includes a second set of clearances that encompasses a first stub of a first differential via, of the pair of differential vias, on a second set of layers. Further still, some implementations described herein provide a PCB that includes a third set of clearances that encompasses a second stub of a second differential via, of the pair of differential vias, on the second set of layers.

The first set of layers may correspond to layers of the PCB that are traversed by the differential vias. The second set of layers may correspond to layers of the PCB that include stubs associated with the differential vias and/or are to be backdrilled. The dimensions of the second set of clearances and the third set of clearances, alone and/or in combination, may be smaller than dimensions of the first set of clearances.

In this way, some implementations described herein increase a quantity of area, of the PCB, that is capable of including conductive material by reducing the dimensions of clearances on layers that are to be backdrilled. Additionally, in this way, some implementations described herein permit conductive traces to be routed between stubs associated with differential vias on layers that are to be backdrilled.

Thereby, some implementations described herein reduce a number of layers that might be needed for a PCB by increasing the quantity of available area on which metal conductive material may be placed (e.g., for signal routing and/or power routing). Additionally, some implementations herein reduce overall lengths of conductive traces of the PCB by permitting the conductive traces to be routed between stubs of differential vias rather than requiring the conductive traces to be routed around the stubs of the differential vias.

By increasing the amount of available area for conductive material and by reducing the overall lengths of the conductive traces, some implementations described herein improve power distribution, improve ground distribution, reduce heat generation, reduce a number of required layers of the PCB, reduce a size of the PCB, reduce a cost of manufacturing the PCB, and/or the like.

Although the term "printed circuit board" will be generally used herein as an example of a substrate for electronic components, in alternative possible implementations, a PCB may be replaced with other substrates or devices, such as, for example, rigid-flex circuits, semiconductor packages, multichip carrier modules (MCMs), micro electro mechanical systems (MEMS), ceramic circuits, midplanes, backplanes, and/or other types of substrates.

Further, although the term "backdrilling" will be used herein to refer to drilling away of vias from the bottom of a PCB, other techniques for removing a portion of a via may alternatively be used, such as techniques based on a laser or optical drill, etc.

Figure 1A:
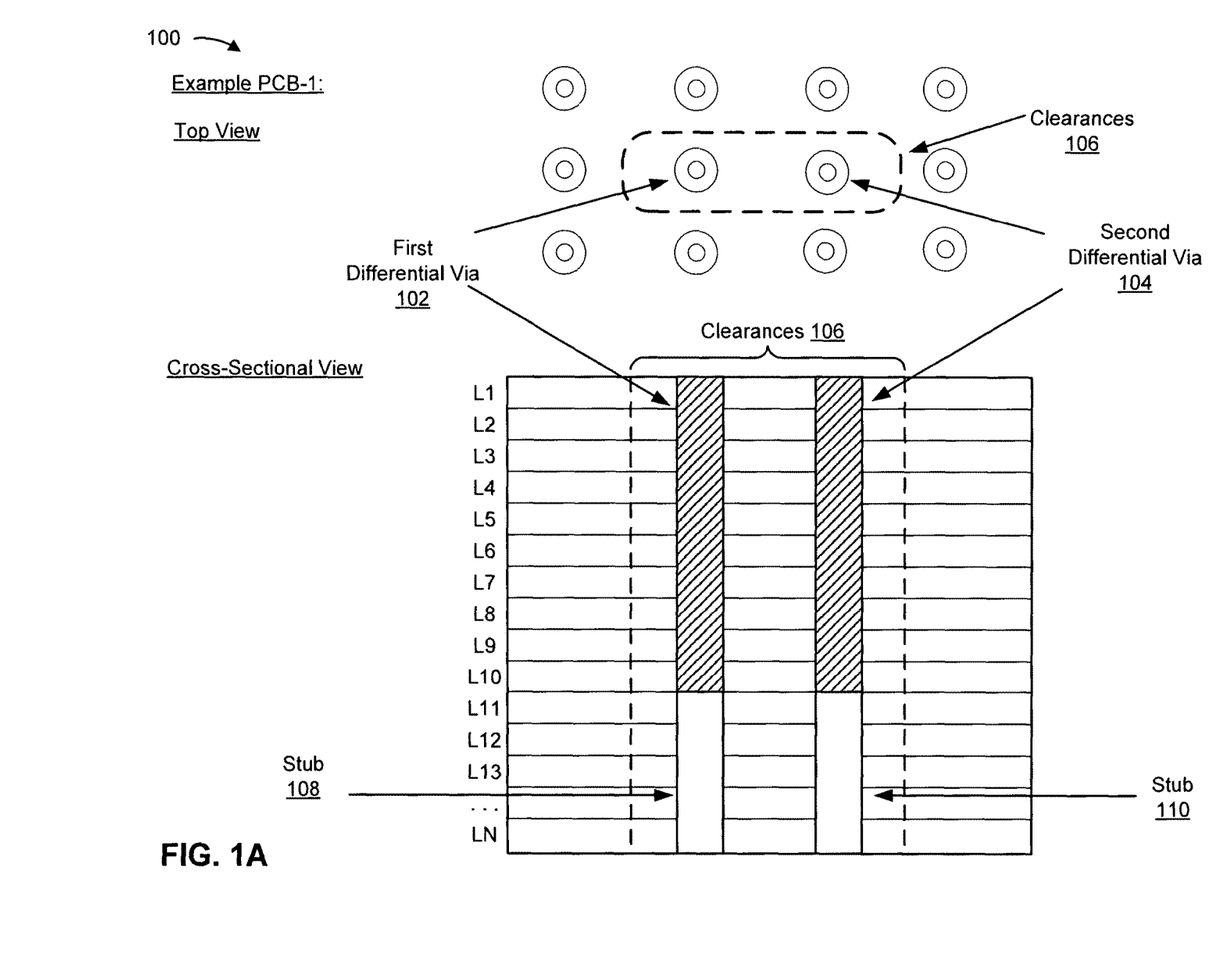
FIGS. 1A-1C are diagrams of an overview of an example implementation described herein.
Figure 1B:
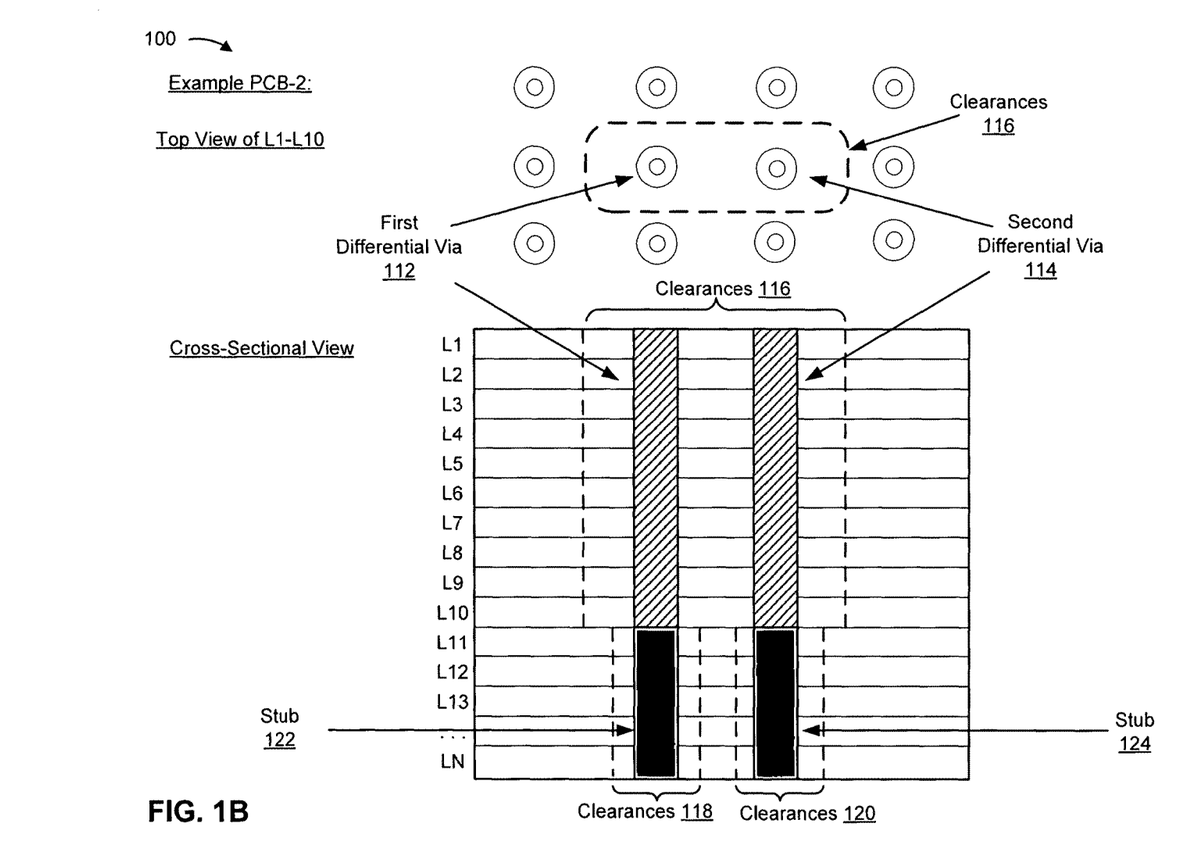
Figure 1C:
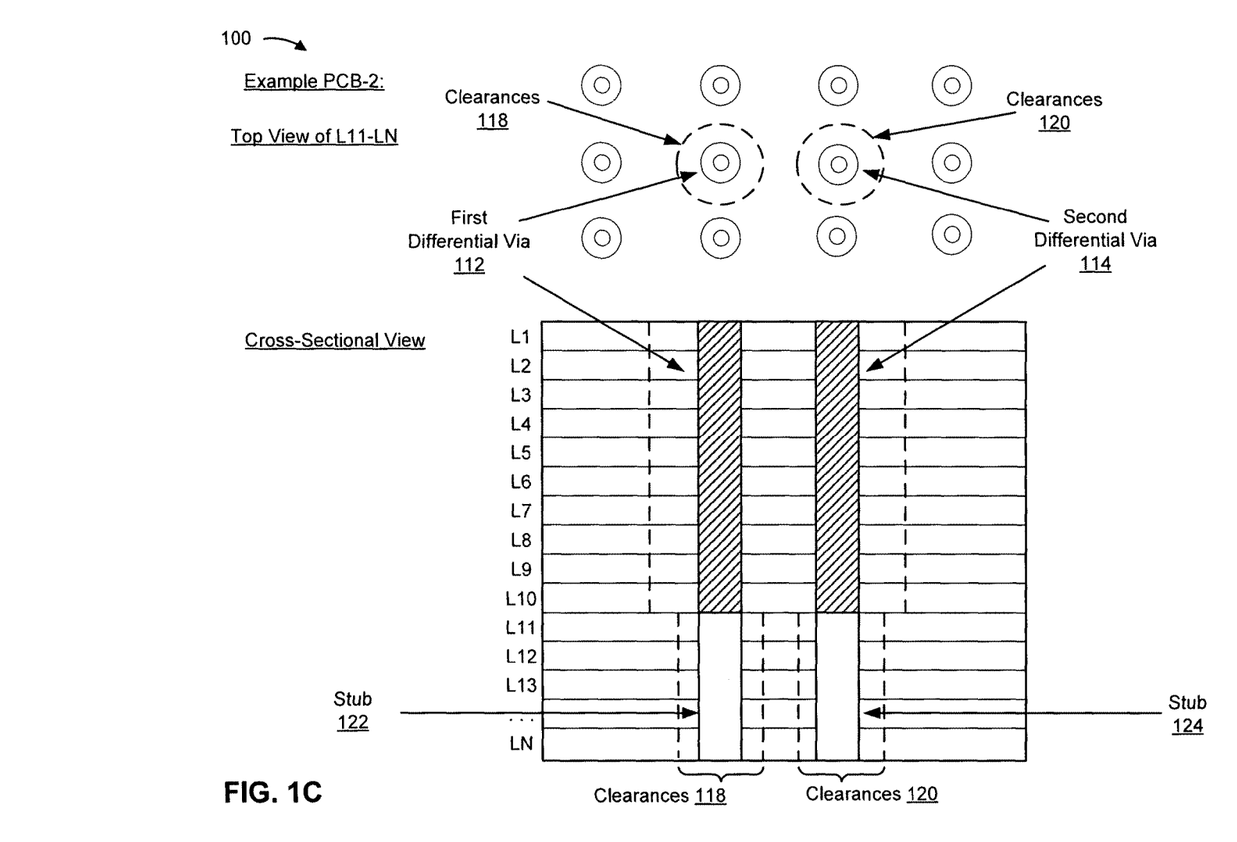

FIGS. 1A-1C are diagrams of an overview of an example implementation 100 described herein. As shown in FIG. 1A, example implementation 100 may include an example PCB-1. As shown in a top view portion of FIG. 1A, PCB-1 may include a first differential via 102, a second differential via 104, and clearances 106 that encompass both first differential via 102 and second differential via 104.

As shown in a cross-sectional view portion of FIG. 1A, first differential via 102 and second differential via 104 may traverse a set of layers (e.g., L1-L10) of PCB-1. For example, first differential via 102 and second differential via 104 may carry differential signals from a first layer of PCB-1 (e.g., L1) to a second layer of PCB-1 (e.g., L10). That is, first differential via 102 and second differential via 104 may be electrically connected to layer 1 and layer 10 of PCB-1.

While not shown, pads may connect first differential via 102 and second differential via 104 to layer 1 and layer 10 of PCB-1, respectively.

As further shown in the cross-sectional view, first differential via 102 may be associated with stub 108, and second differential via 104 may be associated with stub 110. As shown, clearances 106 encompass both stub 108 and stub 110, which reduces the quantity of area available for conductive material that might otherwise be available for routing signals or power, and may also require a conductive trace to be routed around clearances 106 on layers 11 through N.

Clearances 106, that encompass stub 108 and stub 110 on layers 11 through N, might not require the same dimensions as clearances 106 that encompass first differential via 102 and second differential via 104 on layers 1 through 10 because conductive material associated with stub 108 and stub 110 is removed via backdrilling. In other words, stub 108 and stub 110 may not contribute to signal integrity disturbances because stub 108 and stub 110 do not carry signals. As such, the dimensions of clearances 106 encompassing stub 108 and stub 110 might be capable of being reduced because the need to isolate stub 108 and stub 110 from conductive traces of the PCB is less acute than as compared the need to isolate first differential via 102 and second differential via 104 from conductive traces associated with layers 2 through 9.

As shown in FIG. 1B, example implementation 100 may include an example PCB-2. As shown in a top view portion of FIG. 1B, PCB-2 may include a first differential via 112, a second differential via 114, and clearances 116 that encompass both first differential via 112 and second differential via 114 for layers 1 through 10 of PCB-2.

In contrast to PCB-1, and as shown in a cross-sectional view portion of FIG. 1B, PCB-2 may include clearances 118 that encompass a stub 122 associated with first differential via 112, and clearances 120 that encompass a stub 124 associated with second differential via 114 for layers 11 through N of PCB-2 instead of a set of clearances that encompasses both stub 122 and stub 124.

As shown in a top view of FIG. 1C, clearances 118 and 120, respectively, may have smaller dimensions (e.g., a smaller diameter) than dimensions of clearances 106. For example, clearances 118 may encompass stub 122 and may not encompass stub 124. Similarly, for example, clearances 120 may encompass stub 124 and may not encompass stub 122.

In this way, some implementations described herein permit an increased quantity of area for conductive material on layers of a PCB that are associated with stubs by reducing the size of clearances on such layers. Additionally, by including separate clearances that encompass respective stubs associated with a differential pair of vias, some implementations described herein permit conductive traces to be routed between the separate clearances rather than requiring the conductive traces to be routed around a single clearance that encompasses both stubs.

As indicated above, FIGS. 1A-1C are provided merely as an example. Other examples are possible and may differ from what was described with regard to FIGS. 1A-1C. While FIGS. 1A-1C depicts PCBs including a particular number of layers, it should be understood that implementations described herein are applicable to other PCBs that include other numbers of layers.

In this way, some implementations described herein increase a quantity of area, of the PCB, that is capable of including conductive material by reducing the dimensions of clearances on layers that are to be backdrilled. Additionally, in this way, some implementations described herein permit conductive traces to be routed between stubs associated with differential vias on layers that are to be backdrilled.

Thereby, some implementations described herein reduce a number of layers that might be needed for a PCB by increasing the quantity of available area on which metal conductive material may be placed. Additionally, some implementations herein reduce overall lengths of conductive traces of the PCB by permitting the conductive traces to be routed between stubs associated with differential vias rather than requiring the conductive traces to be routed around clearances that encompass the stubs.

Figure 2A:
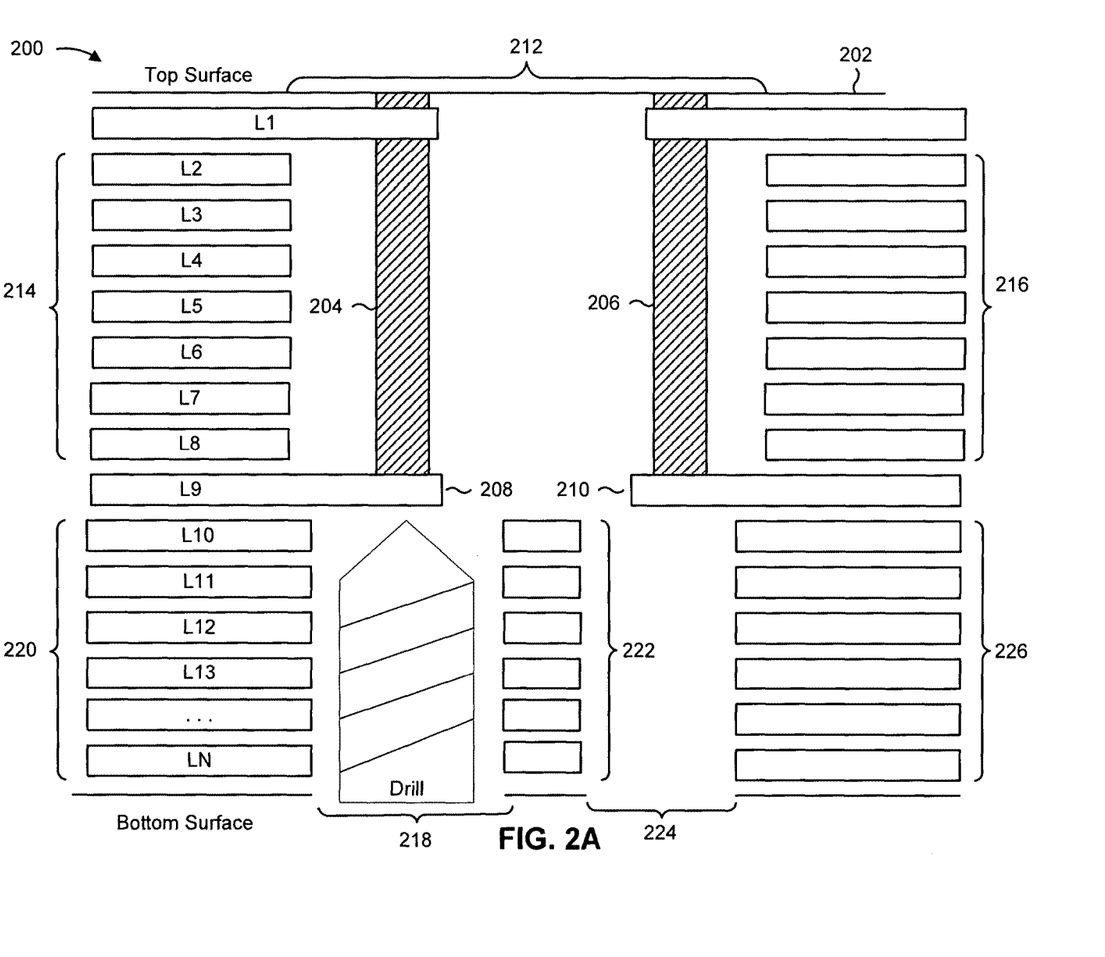
FIGS. 2A-2C are diagrams of an example printed circuit board with reduced clearance dimensions for backdrilled differential vias.
Figure 2B:
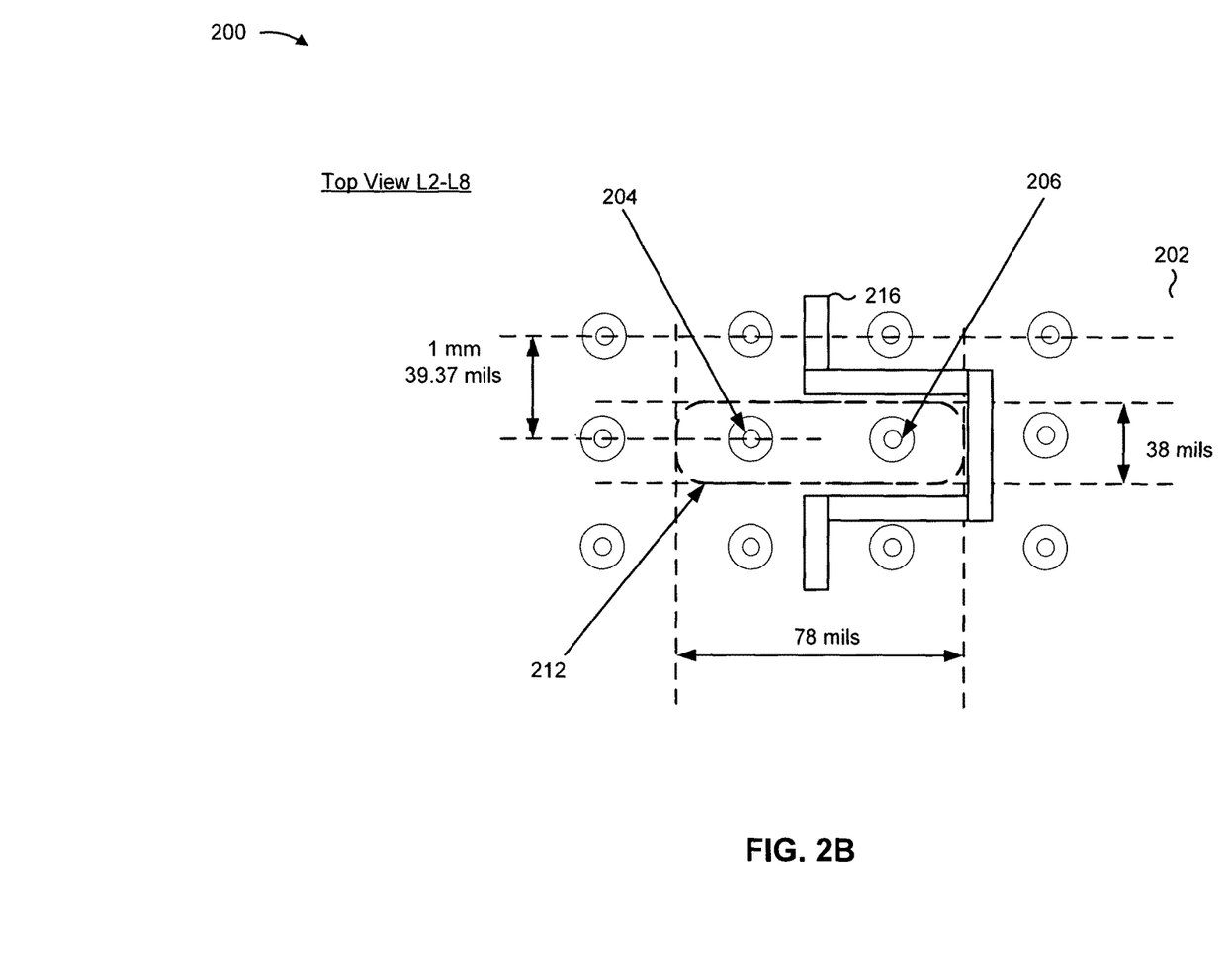
Figure 2C:
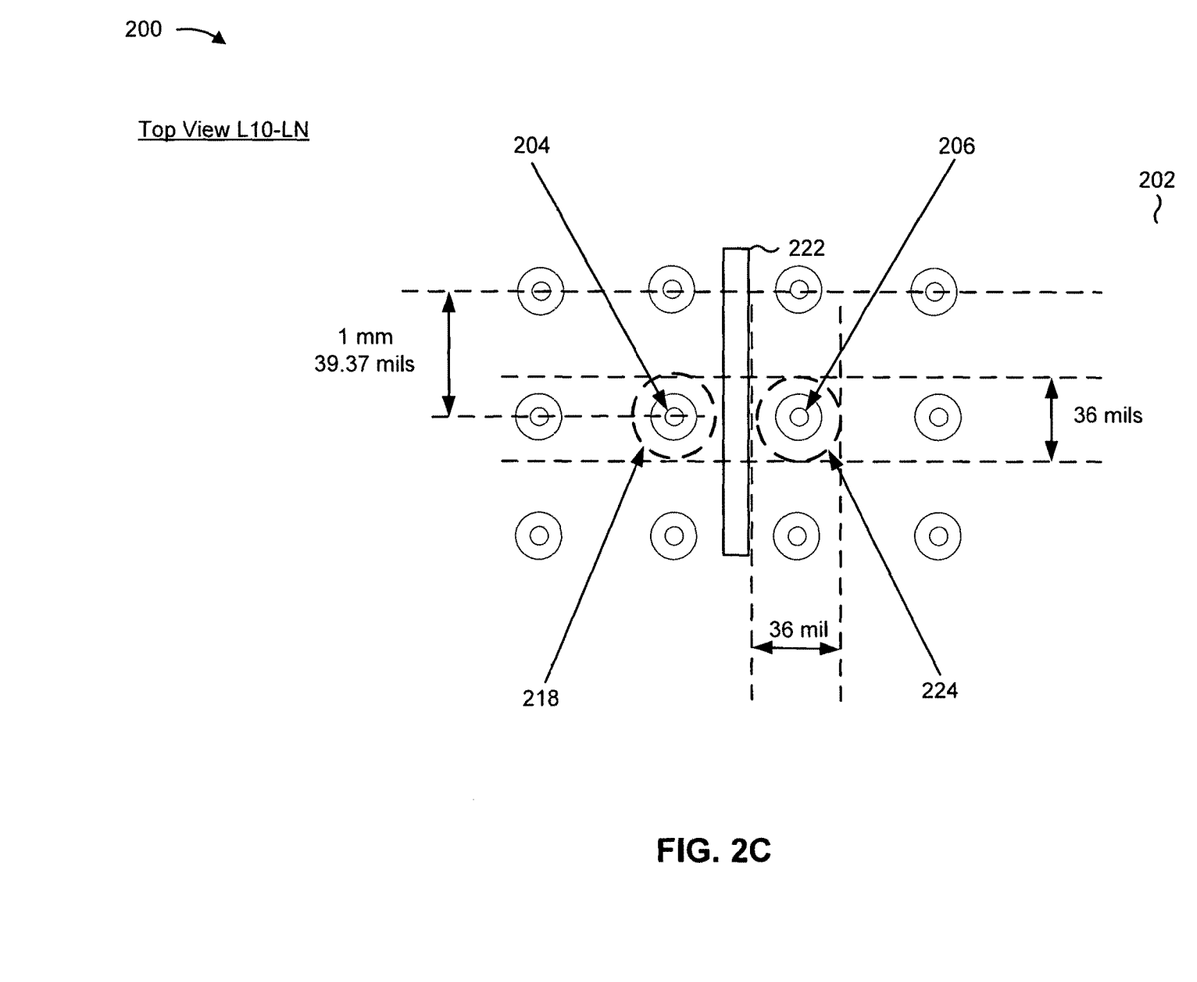

FIGS. 2A-2C are diagrams of an example implementation 200 of a printed circuit board with reduced clearance dimensions for backdrilled differential vias.

FIG. 2A is a diagram illustrating a partial cross-sectional view of an example PCB 202. As shown in FIG. 2A, PCB 202 may include a top surface onto which a component is capable of being connected via a BGA (e.g., through a surface mount process). For example, a component, such as a SerDes application-specific integrated circuit (ASIC), a field programmable gate array (FPGA), a bus, a power supply, an integrated circuit, an optical module, and/or the like, may be connected to the top surface of PCB 202.

As further shown in FIG. 2A, PCB 202 may include a number of example layers (e.g., L1-LN). For example, PCB 202 may include a plurality of horizontally disposed layers (e.g., signal layers, ground layers, power layers, and/or the like). In some implementations, each layer may include conductive traces that route power, signal, and/or ground communication paths through PCB 202. Additionally, or alternatively, each layer may be generally electrically isolated from one another but potentially connected through vias.

As further shown in FIG. 2A, PCB 202 may include a first differential via 204 and a second differential via 206. For example, first differential via 204 and second differential via 206 may be vertically disposed. In some implementations, first differential via 204 and second differential via 206 may vertically connect the different layers (L1-LN) of PCB 202. While PCB 202 is shown as including N layers, it should be understood that other implementations may include a same or different number of layers.

In some implementations, first differential via 204 and second differential via 206 may be selectively connected to particular layers of PCB 202. For example, as shown, first differential via 204 may be connected to a conductive trace 208 on layer 9 (e.g., L9). Additionally, as shown, second differential via 206 may be connected to a conductive trace 210 on layer 9. Additionally, or alternatively, first differential via 204 and second differential via 206 may be electrically isolated from layers 2 through 8 of PCB 202.

In some implementations, stubs associated with first differential via 204 and second differential via 206 may be removed by a backdrilling process (e.g., represented by a drill illustration). For example, as shown, portions of first differential via 204, that extend beyond layer 9 of PCB 202, may be removed, and portions of second differential via 206, that extend beyond layer 9 of PCB 202, may similarly be removed.

As further shown in FIG. 2A, PCB 202 may include a first set of clearances 212 that encompasses both first differential via 204 and second differential via 206. For example, the first set of clearances 212 (e.g., non-conductive pads formed around first differential via 204 and second differential via 206) are defined by the non-conductive spaces between a first set of conductive traces 214 and first differential via 204, the non-conductive spaces between first differential via 204 and second differential via 206, and the non-conductive spaces between second differential via 206 and a second set of conductive traces 216. In this way, the first set of clearances 212 may electrically isolate first differential via 204 and second differential via 206 from conductive traces on layers 2 through 8 of PCB 202.

As further shown in FIG. 2A, PCB 202 may include a second set of clearances 218 that encompasses a backdrilled portion of first differential via 204. For example, the second set of clearances 218 are defined by the non-conductive spaces between a third set of conductive traces 220 and a fourth set of conductive traces 222.

As further shown in FIG. 2A, PCB 202 may include a third set of clearances 224 that encompasses a backdrilled portion of second differential via 206. For example, the third set of clearances 224 are defined by the non-conductive spaces between the fourth set of conductive traces 222 and a fifth set of conductive traces 226.

As further shown in FIG. 2A, the second set of clearances 218 and the third set of clearances 224, alone and/or in combination, may include a smaller area than the first set of clearances 212. For example, the second set of clearances 218 and the third set of clearances 224 may be sized to include relatively smaller areas when compared to the first set of clearances 212 because the second set of clearances 218 and the third set of clearances 224 encompass portions of first differential via 204 and second differential via 206, respectively, that might not carry signals and thereby might not negatively affect conductive traces on layer 10 through layer N of PCB 202 (e.g., affect capacitance, affect impedance, and/or the like).

In this way, more physical area is available on layer 10 through layer N for conductive traces. For example, as shown, conductive traces 222 may be placed between the second set of clearances 218 and the third set of clearances 224, whereas conductive traces may not be placed between first differential via 204 and second differential via 206 on layer 2 through layer 8 of PCB 202 because of the first set of clearances 212. Put another way, if clearances on layer 10 through layer N of PCB 202 were to include the same dimensions as clearances 212, then conductive traces 222 may not be capable of being routed between the second set of clearances 218 and the third set of clearances 224.

FIG. 2B is a diagram illustrating a partial top view of layer 2 through layer 8 of PCB 202. As shown in FIG. 2B, PCB 202 may include a ball grid array pitch of 1 millimeter (mm) (e.g., 39.37 mils (thousandths of an inch)).

As shown in FIG. 2B, the first set of clearances 212 may encompass first differential via 204 and second differential via 206. As shown, the first set of clearances 212 may include an oval shape with rounded portions around first differential via 204 and second differential via 206. As also shown, the width of the first set of clearances 212 across the narrow portion of the first set of clearances 212 may be approximately 38 mils. Further, as shown, the length of the first set of clearances 212 may be approximately 78 mils.

As further shown in FIG. 2B, conductive traces 216 may be routed around the first set of clearances 212. In other words, conductive traces 216 may be incapable of being routed between first differential via 204 and second differential via 206 based on dimensions of the first set of clearances 212.

FIG. 2C is a diagram illustrating a partial top view of layer 10 through layer N of PCB 202. As shown in FIG. 2C, the second set of clearances 218 may encompass a stub (or a backdrilled portion) associated with first differential via 204.

Further, as shown, the third set of clearances 224 may encompass a stub (or a backdrilled portion) associated with second differential via 206.

As further shown in FIG. 2C, the second set of clearances 218 may include a circular shape and may be substantially concentric with the stub associated with first differential via 204. Further, the third set of clearances 224 may include a circular shape and may be substantially concentric with the stub associated with second differential via 206.

As an example, and as shown, the second set of clearances 218 and the third set of clearances 224 may include diameters, respectively, of 36 mils. In some implementations, the dimensions of the second set of clearances 218 and/or the third set of clearances 224 may be determined based on dimensions associated with first differential via 204 and/or second differential via 206. For example, assume that a via drill size, of a drill used to drill first differential via 204 and second differential via 206, is 12 mils. In this case, a backdrill size may be based on the via drill size and a buffer (e.g., 8 mils). Thereby, the backdrill size may be 20 mils (e.g., 12 mils+8 mils=20 mils). Further, the dimensions of the second set of clearances 218 and the third set of clearances 224 may be based on the backdrill size and a buffer (e.g., 16 mils). Thereby, the dimensions of the second set of clearances 218 and the third set of clearances 224 may be 36 mils (e.g., 20 mils+16 mils=36 mils).

In this way, the smaller dimensions of the second set of clearances 218 and the third set of clearances 224, as compared to dimensions of the first set of clearances 212, permit additional conductive traces to be routed on layer 10 through layer N of PCB 202. Additionally, as shown, conductive traces 222 may be routed between stubs associated with first differential via 204 and second differential via 206. In this way, some implementations described herein reduce the overall lengths of the conductive traces, which may improve power distribution, improve ground distribution, reduce heat generation, reduce a number of required layers of the PCB, reduce a size of the PCB, reduce a cost of manufacturing the PCB, and/or the like.

FIGS. 2A-2C illustrate one example design of a PCB. Other examples are possible and may differ from what was described with regard to FIGS. 2A-2C.

Figure 3:
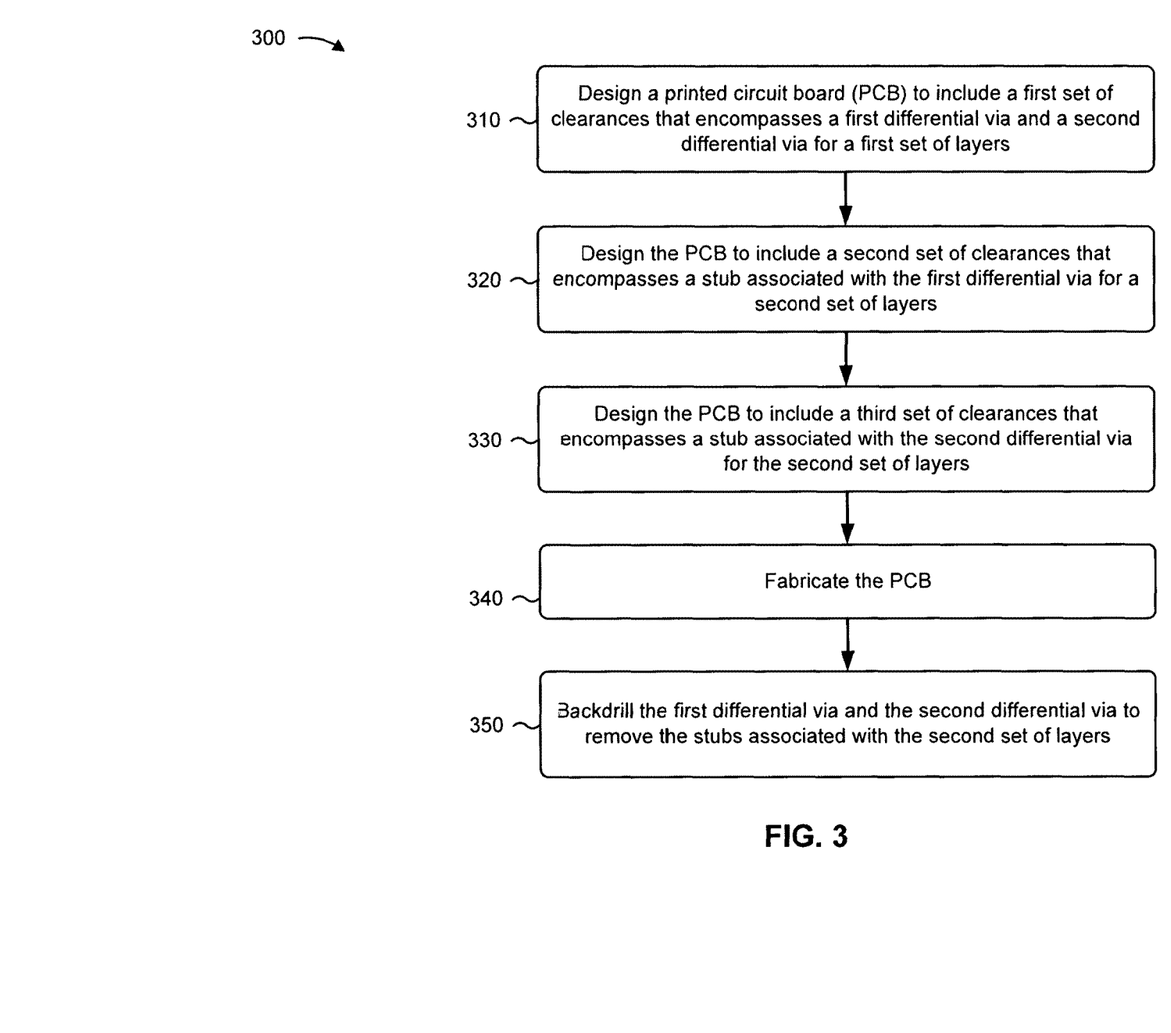
FIG. 3 is a flow chart of an example process for fabricating a printed circuit board with reduced clearance dimensions for backdrilled differential vias.

FIG. 3 is a flow chart illustrating an example process 300 for fabricating a printed circuit board with reduced clearance dimensions for backdrilled differential vias. Process 300 may be applied to the design of a PCB used to route a number of high speed serial signals, such as a SerDes ASIC.

As shown in FIG. 3, process 300 may include designing a printed circuit board (PCB) to include a first set of clearances that encompasses a first differential via and a second differential via for a first set of layers (block 310). For example, as shown in FIGS. 2A and 2B, the PCB may be designed such that a first set of clearances 212 encompasses first differential via 204 and second differential via 206 for a first set of layers of PCB 202 (e.g., L2 through L8).

As further shown in FIG. 3, process 300 may include designing the PCB to include a second set of clearances that encompasses a stub associated with the first differential via for a second set of layers (block 320). For example, as shown in FIG. 2C, a second set of clearances 218 may encompass a stub associated with first differential via 204 and may not encompass a stub associated with second differential via 206 for a second set of layers of PCB 202 (e.g., L10 through LN).

As further shown in FIG. 3, process 300 may include designing the PCB to include a third set of clearances that encompasses a stub associated with the second differential via for the second set of layers (block 330). For example, as shown in FIG. 2C, a third set of clearances 224 may encompass a stub associated with second differential via 206 and may not encompass first differential via 204 for the second set of layers of PCB 202 (e.g., L10 through LN).

As further shown in FIG. 3, process 300 may include fabricating the PCB (block 340). In some implementations, fabricating the PCB may be performed using conventional techniques, such as by performing a multi-layer copper etching to produce the PCB.

As further shown in FIG. 3, process 300 may include backdrilling the first differential via and the second differential via to remove the stubs associated with the second set of layers (block 350). For example, the backdrilling operation may include using a computer controlled drill to remove, from the bottom of PCB 202, stubs associated with first differential via 204 and second differential via 206, respectively. In some implementations, the stubs may be removed up to a depth corresponding to the first set of clearances 212. Referring to FIG. 2A, for example, a drill may drill into PCB 202 through the depth of layer 10.

As indicated above, FIG. 3 is provided merely as an example. Other examples are possible and may differ from what was described with regard to FIG. 3.

Some implementations described herein provide a PCB that includes a first set of clearances that encompasses both differential vias, of a pair of differential vias, on a first set of layers of the PCB. Additionally, some implementations described herein provide a PCB that includes a second set of clearances that encompasses a stub associated with the first differential via, of the pair of differential vias, on a second set of layers. Further still, some implementations described herein provide a PCB that includes a third set of clearances that encompasses a stub associated with the second differential via, of the pair of differential vias, on the second set of layers.

The first set of layers may correspond to layers of the PCB that are traversed by the differential vias. The second set of layers may correspond to layers of the PCB that include stubs associated with the differential vias and/or are to be backdrilled. The dimensions of the second set of clearances and the third set of clearances, alone and/or in combination, may be smaller than dimensions of the first set of clearances.

In this way, some implementations described herein increase a quantity of area, of the PCB, that is capable of including conductive material by reducing the dimensions of clearances on layers that are to be backdrilled. Additionally, in this way, some implementations described herein permit conductive traces to be routed between differential vias on layers that are to be backdrilled. Thereby, some implementations described herein reduce a number of layers that might be needed for a PCB by increasing the quantity of available area on which metal conductive material may be placed for signal, ground, and/or power layers of the PCB. Additionally, some implementations herein reduce overall lengths of conductive traces of the PCB by permitting the conductive traces to be placed between stubs associated with differential vias rather than requiring the conductive traces to be routed around the stubs associated with the differential vias.

By increasing the quantity of available area for conductive material and by reducing the overall lengths of the conductive traces, some implementations described herein improve power distribution, improve ground distribution, reduce heat generation, reduce a number of required layers of the PCB, reduce a size of the PCB, reduce a cost of manufacturing the PCB, and/or the like.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A printed circuit board (PCB) comprising:
   a plurality of horizontally disposed signal layers comprising at least:
      a first horizontally disposed signal layer,
      a second horizontally disposed signal layer, and
      a third horizontally disposed signal layer;
   a first vertically disposed differential via electrically connected to the first horizontally disposed signal layer and the third horizontally disposed signal layer,
      the second horizontally disposed signal layer being isolated from the first vertically disposed differential via, and
      the first vertically disposed differential via being associated with a first vertically disposed stub that extends from a bottom surface of the PCB to the third horizontally disposed signal layer;
   a second vertically disposed differential via electrically connected to the first horizontally disposed signal layer and the third horizontally disposed signal layer,
      the second horizontally disposed signal layer being isolated from the second vertically disposed differential via, and
      the second vertically disposed differential via being associated with a second vertically disposed stub that extends from the bottom surface of the PCB to the third horizontally disposed signal layer;
   a first set of clearances encompassing the first vertically disposed differential via and the second vertically disposed differential via,
      the first set of clearances being defined by at least:
         a first non-conductive space between the second horizontally disposed signal layer and the first vertically disposed differential via, a second non-conductive space between the second horizontally disposed signal layer and the second vertically disposed differential via, and
a third non-conductive space between the first vertically disposed differential via and the second vertically disposed differential via,
the first horizontally disposed signal layer horizontally extending beyond the first non-conductive space in a first direction to connect to the first vertically disposed differential via,
the first horizontally disposed signal layer horizontally extending beyond the second non-conductive space in a second direction to connect to the second vertically disposed differential via,
the third horizontally disposed signal layer horizontally extending beyond the first non-conductive space in the first direction to connect to the first vertically disposed differential via, and
the third horizontally disposed signal layer horizontally extending beyond the second non-conductive space in the second direction to connect to the second vertically disposed differential via;
a second set of clearances encompassing the first vertically disposed stub;
a third set of clearances encompassing the second vertically disposed stub;
a first horizontally disposed signal trace routed:
around the first set of clearances to avoid the third non-conductive space, and
within a space defined by the first horizontally disposed signal layer and the third horizontally disposed signal layer; and
a second horizontally disposed signal trace routed between the second set of clearances and the third set of clearances.

2. The PCB of claim 1, where a clearance, of the first set of clearances, is larger than another clearance of the second set of clearances.

3. The PCB of claim 1, further comprising:
a horizontally disposed ground trace routed between the second set of clearances and the third set of clearances.

4. The PCB of claim 1, where the second set of clearances does not encompass the second vertically disposed stub.

5. The PCB of claim 1, where the second set of clearances and the third set of clearances include a same set of dimensions.

6. The PCB of claim 1, where the first vertically disposed stub and the second vertically disposed stub are backdrilled.

7. The PCB of claim 1, further comprising:
a top surface onto which a component is capable of being mounted using a surface mount process.

8. A device comprising:
a plurality of horizontally disposed layers comprising at least:
a first horizontally disposed layer,
a second horizontally disposed layer, and
a third horizontally disposed layer;
a first differential via electrically connected to the first horizontally disposed layer and the third horizontally disposed layer,
the second horizontally disposed layer being isolated from the first differential via, and
the first differential via being vertically disposed and associated with a first vertically disposed stub that extends from a bottom surface of the device to the third horizontally disposed layer;
a second differential via electrically connected to the first horizontally disposed layer and the third horizontally disposed layer,
the second horizontally disposed layer being isolated from the second differential via, and
the second differential via being vertically disposed and associated with a second vertically disposed stub that extends from the bottom surface of the device to the third horizontally disposed layer;
a first set of clearances associated with the first differential via and the second differential via,
the first set of clearances being defined by at least:
a first non-conductive space between the second horizontally disposed layer and the first differential via,
a second non-conductive space between the second horizontally disposed layer and the second differential via, and
a third non-conductive space between the first differential via and the second differential via,
the first horizontally disposed layer horizontally extending beyond the first non-conductive space in a first direction to connect to the first differential via,
the first horizontally disposed layer horizontally extending beyond the second non-conductive space in a second direction to connect to the second differential via,
the third horizontally disposed layer horizontally extending beyond the first non-conductive space in the first direction to connect to the first differential via, and
the third horizontally disposed layer horizontally extending beyond the second non-conductive space in the second direction to connect to the second differential via;
a second set of clearances associated with the first vertically disposed stub and the second vertically disposed stub;
a first horizontally disposed signal trace routed:
around the first set of clearances to avoid the third non-conductive space, and
within a space defined by the first horizontally disposed layer and the third horizontally disposed layer; and
a second horizontally disposed signal trace routed between a first subset of the second set of clearances and a second subset of the second set of clearances.

9. The device of claim 8, where the first set of clearances is larger than the second set of clearances.

10. The device of claim 8, where the second horizontally disposed signal trace is routed on a layer of the plurality of horizontally disposed layers,
where the first subset encompasses the first vertically disposed stub, and
where the second subset encompasses the second vertically disposed stub.

11. The device of claim 8, further comprising:
a horizontally disposed power trace routed between the first subset of the second set of clearances and the second subset of the second set of clearances on a layer of the plurality of horizontally disposed layers,
the first subset encompassing the first vertically disposed stub, and
the second subset encompassing the second vertically disposed stub.

12. The device of claim 8, where the first subset, of the second set of clearances, does not encompass the second vertically disposed stub.

13. The device of claim 8, where the first set of clearances includes a first set of dimensions that is different than a second set of dimensions associated with the second set of clearances.

14. The device of claim 8, where the first differential via and the second differential via are to carry a pair of differential signals.

15. A method, comprising:
fabricating a printed circuit board (PCB) to include:
- a plurality of horizontally disposed signal layers comprising at least:
  - a first horizontally disposed signal layer,
  - a second horizontally disposed signal layer, and
  - a third horizontally disposed signal layer;
- a first vertically disposed differential via electrically connected to the first horizontally disposed signal layer and the third horizontally disposed signal layer,
  - the second horizontally disposed signal layer being isolated from the first vertically disposed differential via, and
  - the first vertically disposed differential via being associated with a first vertically disposed stub that extends from a bottom surface of the PCB to the third horizontally disposed signal layer;
- a second vertically disposed differential via electrically connected to the first horizontally disposed signal layers and the third horizontally disposed signal layer,
  - the second vertically disposed differential via being associated with a second vertically disposed stub that extends from the bottom surface of the PCB to the third horizontally disposed signal layer;
- a first set of clearances encompassing the first vertically disposed differential via and the second vertically disposed differential via,
  - the first set of clearances being defined by at least:
    - a first non-conductive space between the second horizontally disposed signal layer and the first vertically disposed differential via,
    - a second non-conductive space between the second horizontally disposed signal layer and the second vertically disposed differential via, and
    - a third non-conductive space between the first vertically disposed differential via and the second vertically disposed differential via,
  - the first horizontally disposed signal layer horizontally extending beyond the first non-conductive space in a first direction to connect to the first vertically disposed differential via,
  - the first horizontally disposed signal layer horizontally extending beyond the second non-conductive space in a second direction to connect to the second vertically disposed differential via,
  - the third horizontally disposed signal layer horizontally extending beyond the first non-conductive space in the first direction to connect to the first vertically disposed differential via, and
  - the third horizontally disposed signal layer horizontally extending beyond the second non-conductive space in the second direction to connect to the second vertically disposed differential via;
- a second set of clearances encompassing the first vertically disposed stub;
- a third set of clearances encompassing the second vertically disposed stub;
- a first horizontally disposed signal trace routed:
  - around the first set of clearances to avoid the third non-conductive space, and
  - within a space defined by the first horizontally disposed signal layer and the third horizontally disposed signal layer; and
- a second horizontally disposed signal trace routed between the second set of clearances and the third set of clearances.

16. The method of claim 15, where a clearance, of the first set of clearances, is larger than another clearance of the second set of clearances.

17. The method of claim 15, where a horizontally disposed power trace routed between the second set of clearances and the third set of clearances.

18. The method of claim 15, where a horizontally disposed ground trace routed between the second set of clearances and the third set of clearances.

19. The method of claim 15, where the second set of clearances does not encompass the second vertically disposed stub.

20. The method of claim 15, where the second set of clearances and the third set of clearances include a same set of dimensions.

* * * * *